(12) United States Patent
Yeh et al.

(10) Patent No.: US 6,674,118 B2
(45) Date of Patent: Jan. 6, 2004

(54) PIP CAPACITOR FOR SPLIT-GATE FLASH PROCESS

(75) Inventors: Chung-Ker Yeh, Hsin-Chu (TW); Hung-Cheng Sung, Hsin-chu (JP); Di-Son Kuo, Hsinchu (TW); Chia-Ta Hsieh, Tainan (TW); Yai-Fen Lin, Non-Tour (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/876,596

(22) Filed: Jun. 8, 2001

(65) Prior Publication Data

US 2001/0026973 A1 Oct. 4, 2001

Related U.S. Application Data

(62) Division of application No. 09/347,546, filed on Jul. 6, 1999, now Pat. No. 6,277,686.

(51) Int. Cl.[7] ............................................. H01L 29/788
(52) U.S. Cl. ........................ 257/315; 257/316; 257/317
(58) Field of Search ................................. 257/315–317, 257/298, 532, 535

(56) References Cited

U.S. PATENT DOCUMENTS

| 5,420,449 A | * | 5/1995 | Oji ............................. 257/307 |
| 5,631,188 A | | 5/1997 | Chang et al. ................ 438/253 |
| 5,652,161 A | | 7/1997 | Ahn ............................ 437/43 |
| 5,858,832 A | | 1/1999 | Pan ............................ 438/230 |
| 5,866,451 A | | 2/1999 | Yoo et al. .................... 438/241 |

* cited by examiner

*Primary Examiner*—Thien F Tran
(74) *Attorney, Agent, or Firm*—George O. Saile; Stephen B. Ackerman (57) ABSTRACT

A PIP (Poly-Interpoly-Poly) capacitor with high capacitance is provided in a split-gate flash memory cell. A method is also disclosed to form the same PIP capacitor where the bottom and top plates of the capacitor are formed simultaneously with the floating gate and control gate, respectively, of the split-gate flash memory cell. Furthermore, the thin interpoly oxide of the cell, rather than the thick poly-oxide over the floating gate is used as the insulator between the plates of the capacitor. The resulting capacitor yields high storage capacity through high capacitance per unit area.

6 Claims, 7 Drawing Sheets

PIP CAPACITOR FOR SPLIT-GATE FLASH PROCESS

This is a division of patent application Ser. No. 09/347,546, filing date Jul. 6, 1999, Pip Capacitor For Split-Gate Flash Process, assigned to the same assignee as the present invention.

BACKGROUND OF THE INVENTION (1) Field of the Invention

The present invention relates to semiconductor manufacturing and is more particularly directed to a split-gate flash memory cell having a PIP (Poly-Interpoly oxide-Poly) capacitor with high unit capacitance, and also to a method of forming the same.

(2) Description of the Related Art

With the ever-decreasing of feature sizes, including that of capacitor areas, in very large and ultra large integrated circuit technologies (VLSI and ULSI) of related art, the parameters that affect the capacitance of capacitors are requiring closer scrutiny in order to be able keep the unit capacitance values from being lowered further. That is, a solution must be found to meet the contradictory requirements for increasing the packing density of memory cells on the one hand, and increasing the storage capacity of the same, on the other. As is known in the art, the most important parameters involved in increasing the capacitance of a capacitor are the area of the capacitor, and the dielectric constant and the thickness of the insulator between the plates of the capacitor. It is shown later in the embodiments of the present invention that the low unit capacitance of a conventional split-gate flash memory cell can be increased by simultaneously forming a PIP capacitor together with the polysilicon (poly) gates of the cell where the floating gate poly is used as the bottom plate, the gate oxide as the inter-poly oxide, and the control gate poly as the top plate of the PIP capacitor.

It is common in related art to form capacitors, in addition to resistors, transistors and diodes, in integrated circuits of various types. Capacitors formed within analog integrated circuit fabrications typically assure proper operation of those analog integrated circuits. Capacitors formed within digital integrated circuits typically provide charge storage locations for individual bits of digital data stored with those digital integrated circuits.

A known type of capacitor that is typically, though not exclusively, formed with an integrated circuit is a double layer polysilicon capacitor. Double layer polysilicon capacitors are formed from two substantially planar conductive polysilicon electrodes separated by a dielectric layer. Double layer polysilicon capacitors provide several advantages when used within integrated circuits. For example, double layer polysilicon capacitors may easily be formed within several locations within an integrated circuit.

Figure 1:
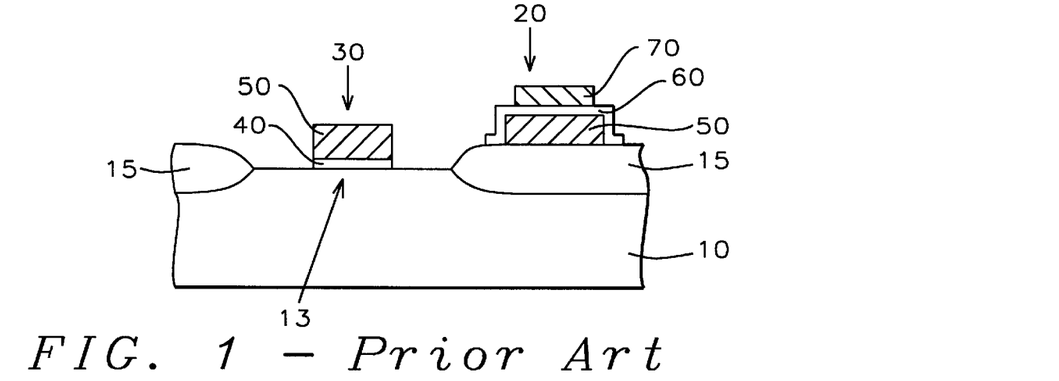
FIG. 1 is a cross-sectional view of a semiconductor substrate showing the forming of a conventional planar capacitor along with a poly gate of prior art.

Such a double layer polysilicon capacitor is shown within a Field Effect Transistor (FET) in FIG. 1. Capacitor (20) is formed along with poly-gate (30) on the same substrate (10). Field oxide (15) defines active region (13) of substrate (10). Poly-gate (30), formed over the active region, comprises a patterned first polysilicon layer (50) separated from substrate (10) by an intervening layer of gate oxide (40). The first bottom plate, or electrode, of capacitor (20) is formed simultaneously from the same first polysilicon layer (50) of poly-gate (30) over the field oxide region (15), as shown in FIG. 1. A patterned insulator layer (60) is next formed over first electrode (50), and a second patterned polysilicon layer (70) over the insulator. Thus, the patterned second polysilicon layer (70) forms the second polysilicon electrode of the double layer polysilicon capacitor (20).

Use of double layer polysilicon capacitors in integrated circuits is common in prior art. Yoo, et al., of U.S. Pat. No. 5,866,451 discloses a method of making a mixed-mode capacitor suitable for either digital or analog circuits integrated with logic and memory in the same chip. A second layer polysilicon layer is patterned to form the top plate of a double layer capacitor in the same chip. In U.S. Pat. No. 5,631,188, Chang, et al., show a double layer polysilicon capacitor exhibiting low voltage coefficient and a method for forming the same. Pan of U.S. Pat. No. 5,858,832, on the other hand, teaches a method of forming within an integrated circuit a high areal capacitance planar capacitor. A split-gate flash EEPROM cell is disclosed by Ahn in U.S. Pat. No. 5,652,161.

In the present invention, a different double layer polysilicon capacitor in a split-gate flash memory cell is disclosed. When a double layer polysilicon capacitor is formed simultaneously with the forming of a split-gate flash memory cell, as described later in the embodiments of the present invention, if the poly-oxide between the floating gate and the control gate of the split-gate flash is used as the insulator between the first and second electrodes of the capacitor, then the unit capacitance of the capacitor becomes low due to the excessive thickness of the poly-oxide. It is disclosed later in the embodiments that with a judicious use of an additional masking step, a much thinner gate-oxide, in place of the thick poly-oxide, can be used, thereby achieving a Poly-Interpoly-Poly (PIP) capacitor with higher unit capacitance in a split-gate flash memory cell.

SUMMARY OF THE INVENTION

It is therefore, an object of this invention to provide a PIP (Poly-Interpoly-Poly) capacitor with high capacitance in a split-gate flash memory cell.

It is another object of the present invention to provide a method of forming a PIP capacitor with high capacitance in a split-gate flash memory cell.

It is still another object of this invention to provide a method of forming a PIP capacitor having its first and second electrodes simultaneously formed with the polysilicon floating and control gates, respectively, of a split-gate flash memory cell.

It is yet another object of the present invention to provide a method of using the thin gate oxide layer of a split-gate flash memory cell in place of the poly-oxide of the polysilicon layer as the insulating layer between the electrodes of a PIP capacitor, thus yielding a high unit capacitance and high storage capacity for the memory cell.

These objects are accomplished by providing a semiconductor substrate having a gate region and a capacitor region, and a first gate dielectric layer formed thereon; a first polysilicon layer forming the floating gate of said memory cell in said gate region, and the first electrode of said PIP capacitor in said capacitor region; a second polysilicon layer forming the control gate of said memory cell in said gate region, and the second electrode of said PIP capacitor in said capacitor region; a second gate dielectric layer and a poly-oxide layer between the floating gate and the control gate in said gate region; and a third gate dielectric layer as the insulator layer between said first electrode and said second electrode of said PIP capacitor.

The objects are further accomplished by providing a semiconductor substrate having a gate region and a capacitor region, and a first gate dielectric layer formed thereon; depositing a first polysilicon layer to form the floating gate of said memory cell in said gate region, and to form the first electrode of said PIP capacitor in said capacitor region; forming a poly-oxide layer over said first polysilicon layer; forming a second gate dielectric layer over said substrate including said gate region and said capacitor region; ion implanting said first polysilicon layer in said capacitor region to control dopant level in said first electrode of said PIP capacitor; performing an oxide dip to remove said second gate dielectric layer from said substrate; forming a third gate dielectric layer over said substrate including over said poly-oxide layer over said floating gate, and over said first electrode of said PIP capacitor; and depositing a second polysilicon layer to form the control gate of said memory cell in said gate region, and to form the second electrode of said PIP capacitor in said capacitor region on said substrate.

BRIEF DESCRIPTION OF THE DRAWINGS

FIGS. 3a–3i show the various process steps of forming a new Poly-Interpoly-Poly (PIP) capacitor simultaneously with the forming of a split-gate flash memory cell, according to the present invention. More specifically.

DESCRIPTION OF THE PREFERRED EMBODIMENTS

Referring now to drawings 2a–2f and 3a–3i, there are shown alternate methods of forming a double layer polysilicon capacitor. The preferred method shown in FIGS. 3a–3i yield a PIP (Poly-Interpoly-Poly) capacitor having high capacitance per unit area. In the method shown in FIGS. 2a–2f as currently practiced in the manufacturing line, a thick poly-oxide forms the insulator between the first and second electrodes—bottom and top plates, respectively—of the double layer polysilicon capacitor, thus resulting in low unit capacitance. It is disclosed later that by employing different methods, the PIP capacitor insulator can be formed from a much thinner gate oxide layer, thus yielding much higher unit capacitance.

Figure 2A:
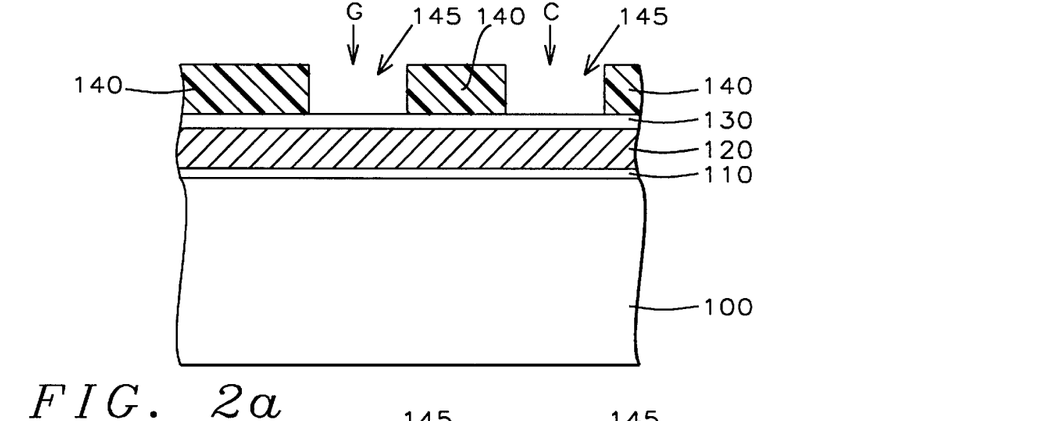
FIGS. 2a–2f show the various process steps of forming a conventional double layer polysilicon capacitor simultaneously with the forming of a split-gate flash memory cell as currently practiced in the present manufacturing line.
Figure 2B:
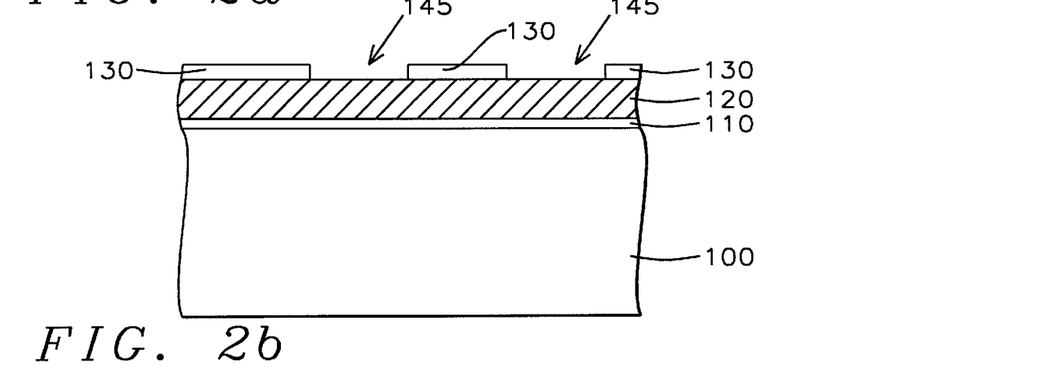
Figure 2C:
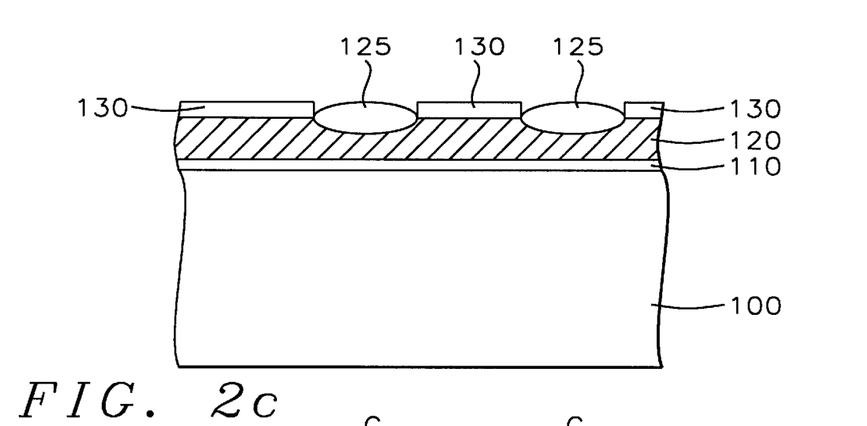
Figure 2D:
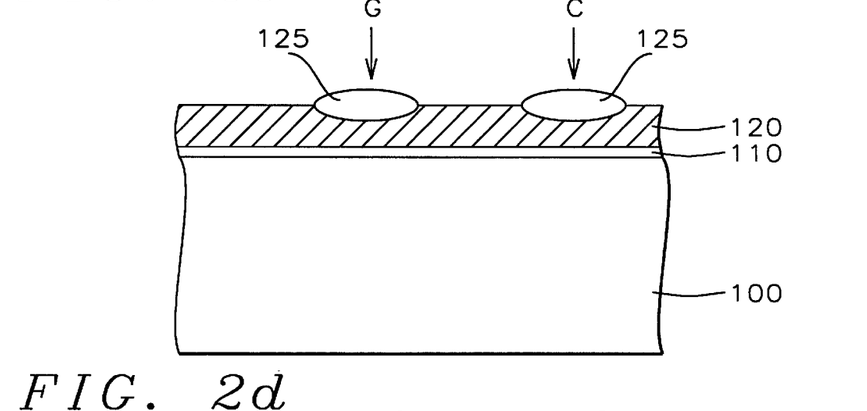
Figure 2E:
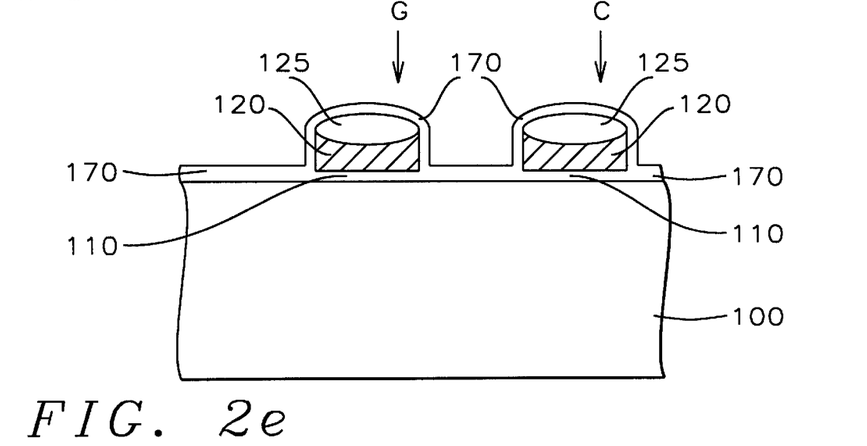
Figure 2F:
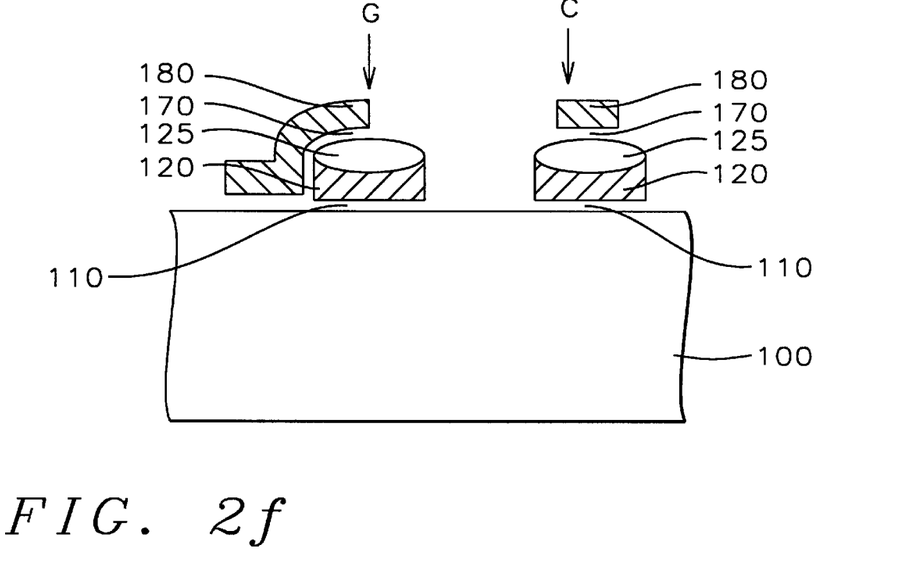

In current practice, substrate (100) is provided with gate region (G) and capacitor region(C) as shown in FIG. 2a. A first gate dielectric layer, or floating gate oxide layer (110), is formed over both (G) and (C) regions on the substrate, followed by the forming of first polysilicon layer (120) and then nitride layer (130) as shown also in FIG. 2a. A photoresist layer (140) is next formed and patterned over the substrate with openings (145) corresponding to gate and capacitor regions. Hole patterns (145) are then transferred into nitride layer (130) by etching the nitride layer while using photoresist layer (140) as a mask as shown in FIG. 2b. Subsequently, the photoresist layer is removed and now using the patterned nitride layer as a hard-mask, the portions of the first polysilicon layer exposed at the bottom of the openings in the nitride layer are wet-oxidized to form poly-oxide layers (125) as shown in FIG. 2c. The nitride layer is no longer needed, therefore, removed as seen in FIG. 2d. Using poly-oxide layers (125) as another hard-mask, the portions of the exposed first polysilicon layer are etched to form a floating gate in region (G) and the bottom plate or the first electrode of a capacitor in region (C) from the same polysilicon layer (120) as shown in FIG. 2e. Next, an intergate or interpoly dielectric layer (170) is conformally formed both over the floating gate and the first electrode, that is, over layer (120), including over the poly-oxide layers (125), as shown in FIG. 2e. It will be noted that layer (170) is primarily needed on the sidewalls of the floating gate as an intergate dielectric between floating gate (120) and control gate (180) to be formed next, as shown in FIG. 2f. Poly-oxide layer (125) serves as an insulator on the top portions of both the floating gate and first electrode. Both the control gate and the second electrode, or the top plate of the capacitor are formed together by depositing a second polysilicon layer (180) over the conformal dielectric layer (170) and patterning it as shown in FIG. 2f. It is the thick combined poly-oxide layer (125) along with the dielectric layer (170) which serve as the insulator for the capacitor that causes the unit capacitance of the double layer polysilicon capacitor to be low, as described below.

In the preferred embodiment shown in FIGS. 3a–3i, the unit capacitance of the disclosed PIP capacitor is increased substantially by substituting a thin gate dielectric layer in place of the presently used poly-oxide layer as the insulator between the electrodes of the capacitor.

Figure 3A:
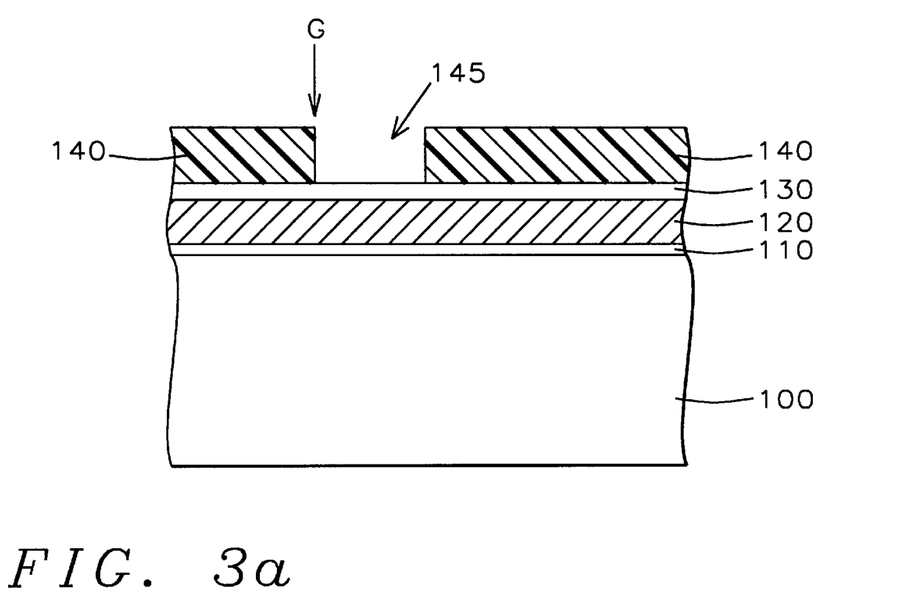
FIG. 3a is a cross-sectional view of a semiconductor substrate showing the forming and patterning of a photoresist layer on successively formed layers of gate oxide, polysilicon and nitride according to this invention.

In FIG. 3a, substrate (100) is provided with a first gate dielectric layer (110) having a thickness between about 70 to 150 Å. The dielectric layer is preferably an oxide formed by thermal oxidation in an oxidation furnace at a temperature range between about 700 to 1000° C. Alternatively, the oxide can be formed by an atmospheric or low pressure chemical vapor deposition process as is well known.

A first polysilicon layer (120) is next formed over the first gate dielectric layer through an LPCVD method employing silane $SiH_4$ as a silicon source material at a temperature range between about 500 to 700° C. It is preferred that the thickness of the first polysilicon layer is between about 500 to 2000 Å.

This is followed by the forming of nitride layer (130) also shown in FIG. 3a. Nitride layer is formed by reacting dichlorosilane ($SiCl_2H_2$) with ammonia ($NH_3$) in an LPCVD at a temperature range between about 700 to 800° C. with a preferred thickness between about 500 to 1500 Å.

Figure 3B:
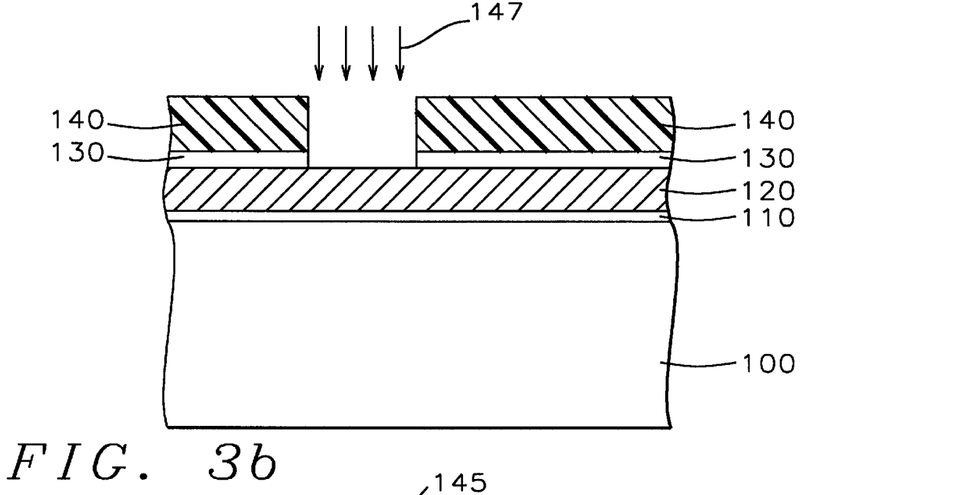
FIG. 3b is a cross-sectional view of a semiconductor substrate showing the ion implanting of the first polysilicon layer of FIG. 3a, according to this invention.
Figure 3C:
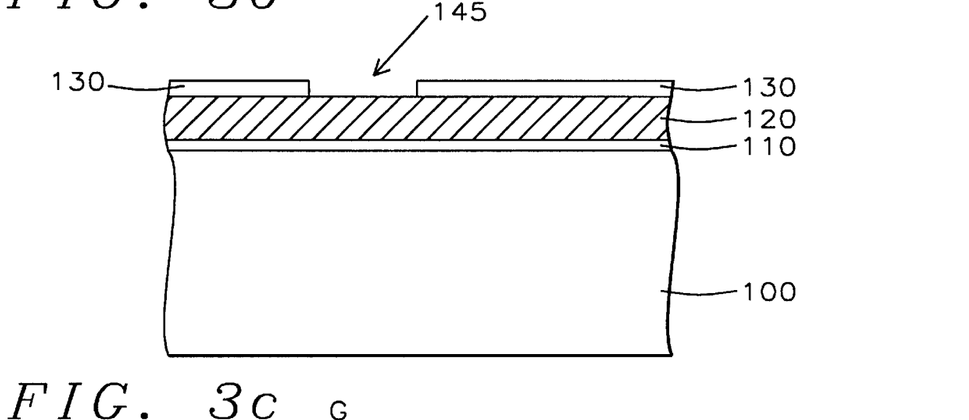
FIG. 3c is a cross-sectional view of a semiconductor substrate showing the removal of the photoresist layer from the substrate of FIG. 3b, according to this invention.

A photoresist layer (140) is next formed to a thickness between about 0.8 to 1.2 micrometers ($\mu$m), and patterned over the substrate with an opening (145) corresponding to a gate region (G). Hole pattern (145) is then transferred into nitride layer (130) by etching the nitride layer using photoresist layer (140) as a mask as shown in FIG. 3b. Preferably the nitride layer is dry etched using gases $CHF_3$ and $CF_4$. Before the photoresist layer is removed, first polysilicon layer is implanted using phosphorous or arsenic ions (147) at a dosage level between about $1\times10^{14}$ to $1\times10^{15}$ atoms/cm$^2$ and energy level between about 10 to 40 KeV as shown in the same FIG. 3b. The implant will then aid in the next step of oxidization of the polysilicon layer.

Figure 3D:
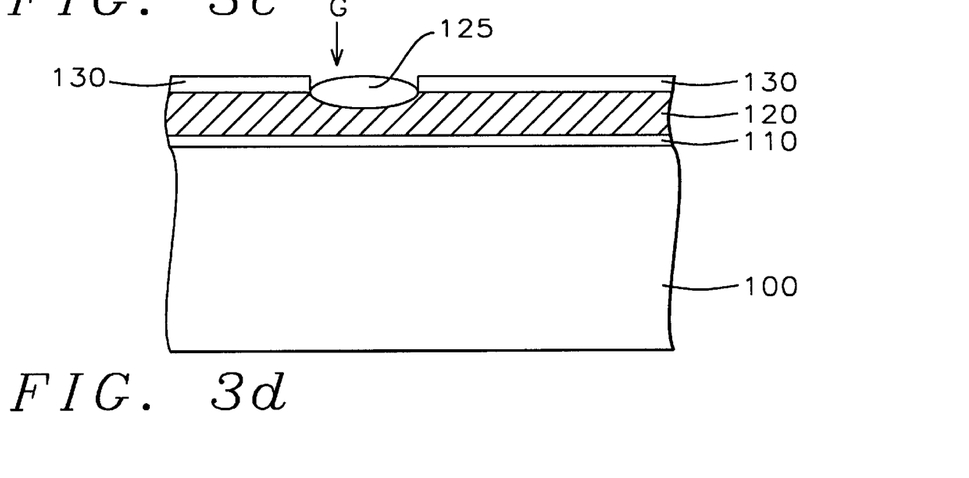
FIG. 3d is a cross-sectional view of a semiconductor substrate showing the forming of poly-oxide on the polysilicon layer of FIG. 3c, according to this invention.

Subsequently, the first photoresist layer is removed (FIG. 3c) by oxygen plasma ashing, and now using the patterned nitride layer as a hard-mask, the portion of the first polysilicon layer exposed at the bottom of opening (145) in the nitride layer is wet-oxidized to form poly-oxide layer (125) shown in FIG. 3d. It is preferred that the oxidization temperature is between about 800 to 1000° C. Afterwards, nitride layer (130) is removed exposing the first polysilicon layer not covered by poly-oxide layer (125).

Figure 3E:
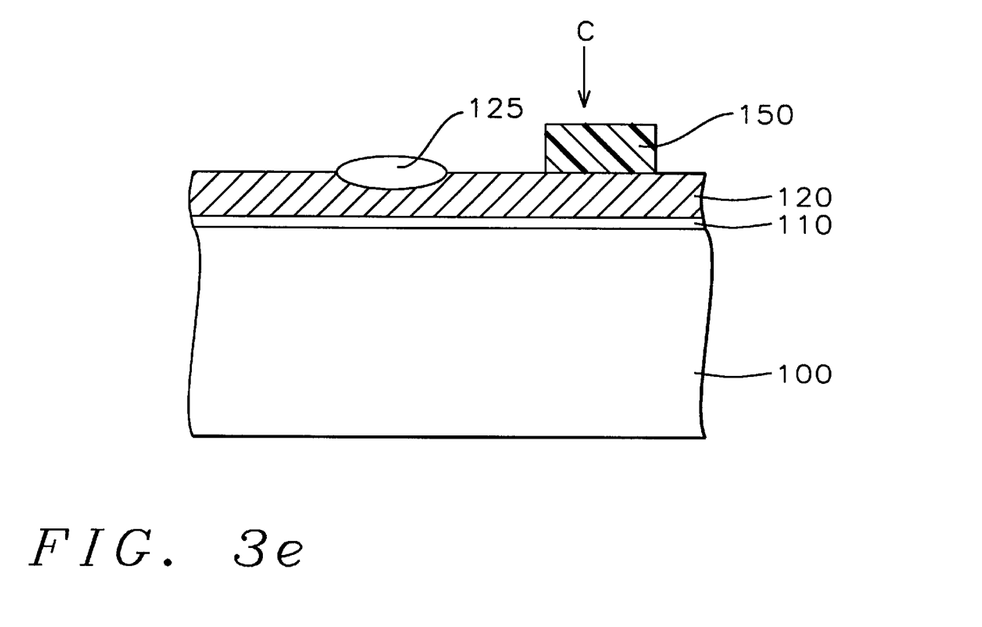
FIG. 3e is a cross-sectional view of a semiconductor substrate showing the forming of a second photoresist layer on the capacitor region of the substrate of FIG. 3d, according to this invention.
Figure 3F:
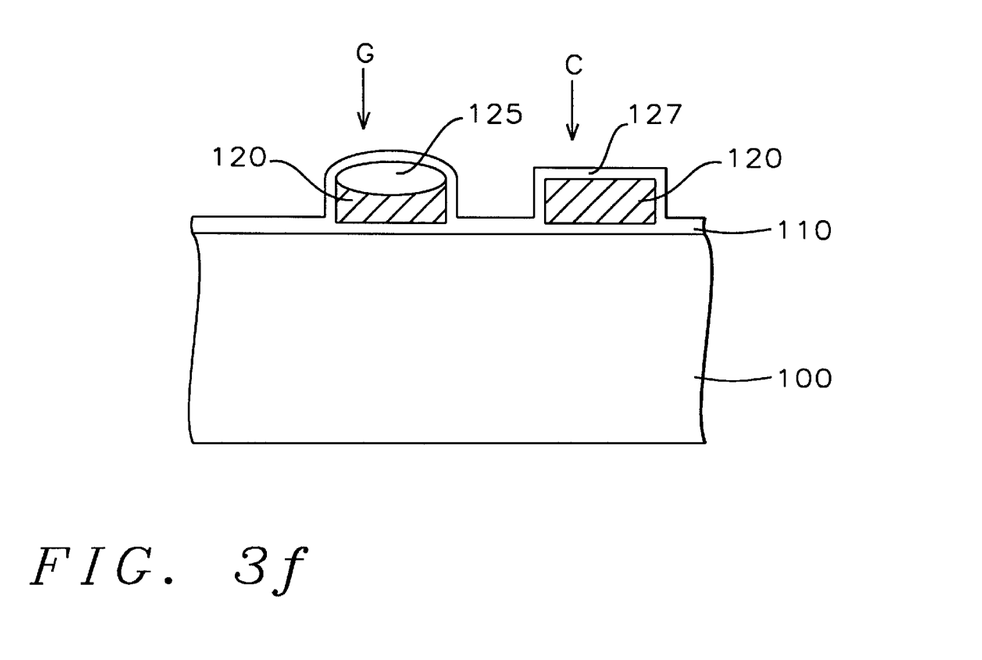
FIG. 3f is a cross-sectional view of a semiconductor substrate showing the forming of a second gate dielectric layer on the floating gate and the bottom plate, or the first electrode, in the capacitor region of FIG. 3e, according to this invention.

As a main feature and key aspect of the present invention, regions (C) where capacitors are to be formed are defined by forming second photoresist layer (150) and patterned accordingly as shown in FIG. 3e. Polysilicon layer (120) is next etched using recipe $Cl_2$ and HBr, thus forming a floating gate underlying the poly-oxide layer and the first, or bottom electrode of the PIP capacitor of the invention. It will be noted that the same first polysilicon layer (120) forms the floating gate as well as the first electrode as shown in FIG. 3f. However, it will be appreciated by those skilled in the art that the method disclosed here avoids having a thick poly-oxide layer over the first electrode of the PIP capacitor to be formed.

Subsequently, second gate dielectric layer (127) is formed over the substrate, including over the poly-oxide of the floating gate and over the first electrode of the PIP capacitor to be formed. The second gate dielectric layer is thermally formed preferably at a temperature between about 800 to 1000° C., and to a thickness between about 100 to 300 Å, thus yielding a combined thickness of the second gate dielectric layer and poly-oxide between about 100 to 500 Å.

Figure 3G:
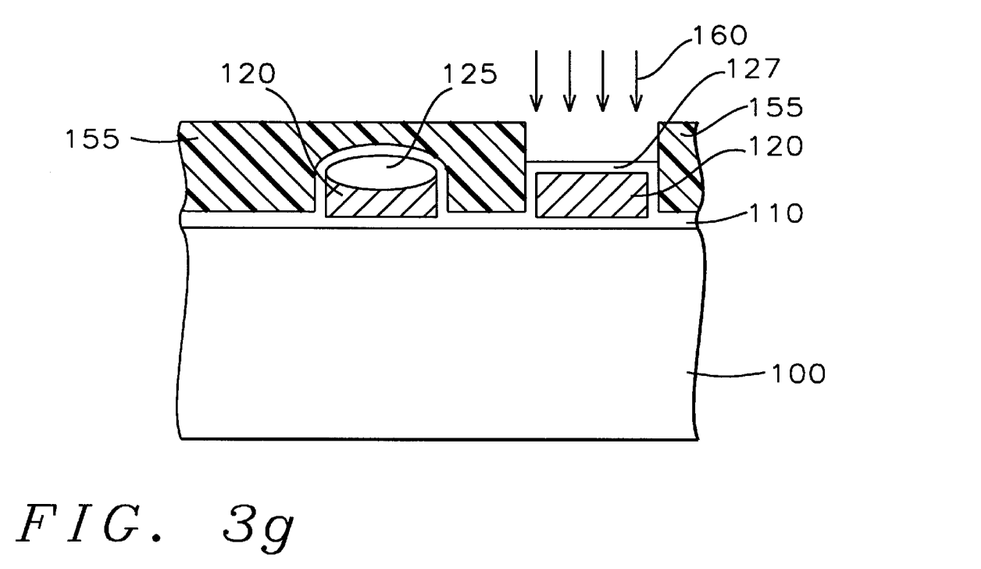
FIG. 3g is a cross-sectional view of a semiconductor substrate showing the patterning of a third photoresist layer and the ion implanting on the capacitor region of the substrate of FIG. 3d, according to this invention.

As another key step, it is important that the polysilicon first electrode is implanted once again so that it has a dopant level higher than that of the floating gate. This is accomplished by forming third photoresist layer (155) formed over the substrate, and patterned to form opening (160) over the capacitor region (C), as shown in FIG. 3g. Implanting is then performed through opening (160) preferably with phosphorous ions at a dosage level between about $1\times10^{15}$ to $\times10^{16}$ atoms/cm$^2$ and energy level between about 10 to 40 KeV.

Figure 3H:
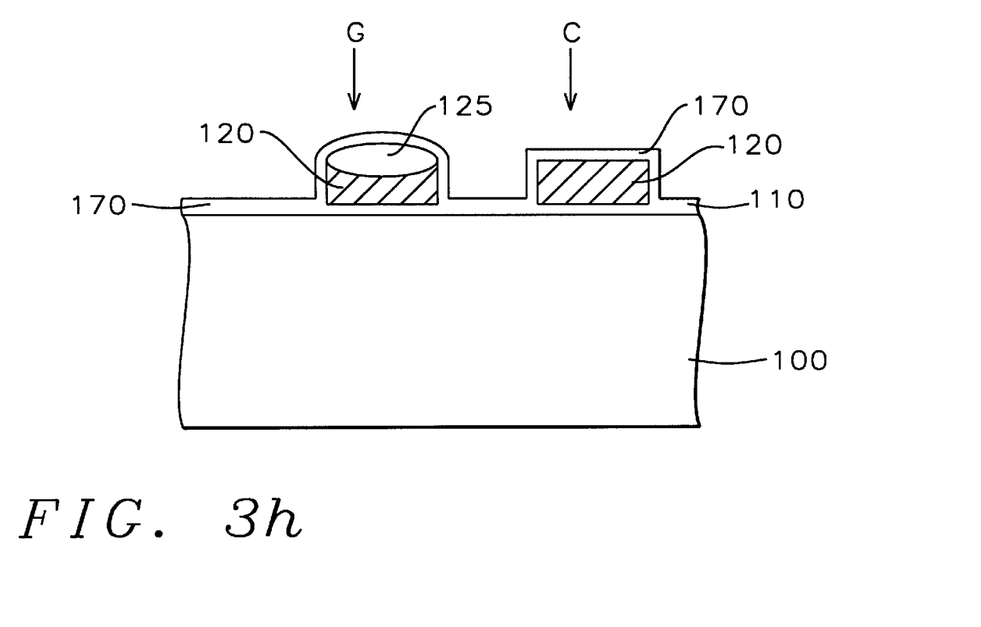
FIG. 3h is a cross-sectional view of a semiconductor substrate showing the forming of a third gate dielectric layer on the floating gate and first electrode in the capacitor region of FIG. 3g, according to this invention.

After the implanting of the first electrode, third photoresist layer (155) is removed. Second gate dielectric layer (127) must also be removed as the ion implanting of the previous step may have damaged the dielectric, and, as is well known, a damaged dielectric will then suffer leakage during operation. The removal is accomplished by performing an oxide dip of the entire substrate. It will be known to those skilled in the art that this step does not necessarily require an extra mask step as the periphery of the substrate is usually dipped to remove the oxide layer from the peripheral region. Hydrofluoric solution is used for the oxide dip. Next, a new third gate dielectric layer (170) is formed over the substrate including the gate region (G) and capacitor region (C) as shown in FIG. 3h. It is preferred that a conformal oxide layer having a thickness between about 80 to 200 Å is formed thermally at a temperature between about 800 to 1000° C.

Figure 3I:
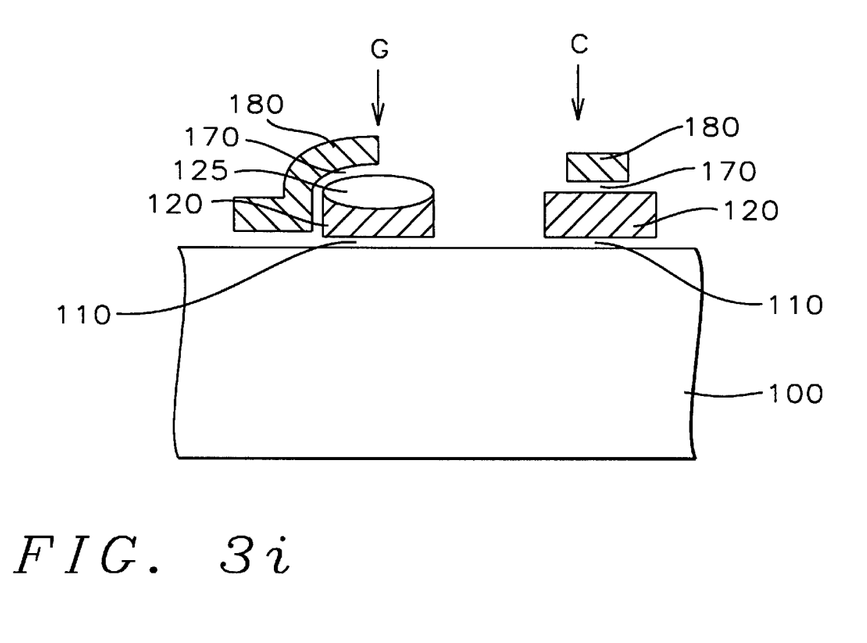
FIG. 3i is a cross-sectional view of a semiconductor substrate showing the forming of the control gate and the top plate, or the second electrode, of the PIP capacitor of this invention formed simultaneously with the split-gate flash memory cell, according to this invention.

Comparing FIG. 3h with FIG. 2e, it will be noted that layer (170) is essential here, because it will serve as the only insulator layer between the bottom and top plates, or, first and second electrodes, respectively, of the PIP capacitor to be formed in region (C). On the other hand, layer (170) is primarily needed on the sidewalls of the floating gate as an intergate dielectric between floating gate (120) and control gate (180) to be formed next, as shown in FIG. 3i. Polyoxide layer (125) serves as an insulator on the top portion of the floating gate.

Both the control gate and the second electrode, or the top plate of the capacitor are formed together depositing a second polysilicon layer (180) over the third conformal dielectric layer (170) and patterning it as shown in FIG. 3i. The second polysilicon layer is also formed through an LPCVD method employing silane $SiH_4$ as a silicon source material at a temperature range between about 500 to 700° C. It is preferred that it has a thickness between about 1000 to 3000 Å. The forming of the PIP capacitor along with the split-gate flash memory cell is completed by depositing tungsten silicide (not shown) to make the necessary low resistance contacts for the control gate with the word-line (not shown) and for the PIP capacitor. The preferred thickness of the silicide layer is between about 200 to 500 Å.

It will be apparent to the workers in the field that the disclosed Poly-Interpoly-Poly, or, PIP, capacitor of the present invention has the advantage of employing a thin gate insulator layer in place of the relatively thick poly-oxide layer that is conventionally used. Standard capacitors usually exhibit a unit capacitance in the range between about 0.87 to 0.91 femto-farads (fF)/$\mu$m$^2$. This is to be compared with a unit capacitance of between about 1.06 to 1.10 measured with the disclosed PIP capacitor. It is found that in addition to the favorable thickness of the third gate dielectric layer of between about 50 to 100 Å, the removal of the damaged second dielectric layer with oxide dip and the use of phosphorous ions in place of arsenic ions also help improve the unit capacitance of the PIP capacitor.

It will be appreciated by those skilled in the art that the disclosed PIP capacitor is especially suitable for manufacture with a split-gate flash process. Such a capacitor can be effectively used as a voltage pump for a flash cell, for instance. Though specific details of the method are disclosed here for a specific application, other similar process steps may be employed for other applications, such as for forming a mixed-mode capacitor in an embedded flash cell.

That is to say, while the invention has been particularly shown and described with reference to the preferred embodiments thereof, it will be understood by those skilled in the art that various changes in form and details may be made without departing from the spirit and scope of the invention.

What is claimed is:

1. A PIP (Poly-Interpoly-Poly) capacitor with high capacitance integrated with a split-gate flash memory cell comprising:

a semiconductor substrate having a split gate region and a capacitor region, and a first gate dielectric layer formed on said split gate region and said capacitor region;

a first polysilicon layer forming the floating gate of said memory cell in said split gate region, and the first electrode of said PIP capacitor in said capacitor region;

a poly-oxide layer formed on said floating gate;

a second polysilicon layer forming the control gate of said memory cell in said split gate region, and the second electrode of said PIP capacitor in said capacitor region;

a second gate dielectric layer beneath said control gate and over said poly-oxide on said floating gate and over said substrate in said split gate region, said second gate dielectric and said poly-oxide forming an inter-gate dielectric layer;

said second gate dielectric layer as the insulator layer between said first electrode and said second electrode of said PIP capacitor.

2. A PIP capacitor integrated with a split-gate flash memory cell of claim 1, wherein said first polysilicon layer has a thickness between about 500 to 2000 Å.

3. A PIP capacitor integrated with a split-gate flash memory cell of claim 1, wherein said second polysilicon layer has a thickness between about 1000 to 2000 Å.

4. A PIP capacitor integrated with a split-gate flash memory cell of claim 1, wherein said first polysilicon layer in said capacitor region is further comprised of a dopant level higher than the dopant level in the first polysilicon layer in said split-gate region.

5. A PIP capacitor integrated with a split-gate flash memory cell of claim 1, wherein said inter-gate dielectric layer has a combined thickness between about 100 to 500 Å.

6. A PIP capacitor integrated with a split-gate flash memory cell of claim 1, wherein said second gate dielectric layer as the insulator layer between said second electrode and said second electrode of said PIP capacitor has thickness between about 50 to 200 Å.

* * * * *